United States Patent [19]

Asai

[11] Patent Number: 5,548,136
[45] Date of Patent: Aug. 20, 1996

[54] SUBSTRATE WITH A COMPOUND SEMICONDUCTOR SURFACE LAYER AND METHOD FOR PREPARING THE SAME

[75] Inventor: Shuji Asai, Tokyo, Japan

[73] Assignee: NEC Corporation, Tokyo, Japan

[21] Appl. No.: 272,041

[22] Filed: Jul. 8, 1994

[30]  Foreign Application Priority Data

Jul. 8, 1993  [JP]  Japan ................................. 5-193070

[51] Int. Cl.$^6$ ............................................. H01L 31/0328
[52] U.S. Cl. ........................................... 257/190; 257/200
[58] Field of Search .............................. 257/200, 190, 257/463, 85, 90, 440

[56]  References Cited

U.S. PATENT DOCUMENTS

| | | | |
|---|---|---|---|
| 4,180,825 | 12/1979 | Mason | 257/200 |
| 4,316,205 | 2/1982 | Aoki et al. | 257/463 |
| 4,774,205 | 9/1988 | Choi et al. | 437/59 |
| 4,914,053 | 4/1990 | Matyi et al. | 437/90 |
| 4,928,154 | 5/1990 | Unemo et al. | 257/190 |
| 5,413,951 | 5/1995 | Ohori et al. | 437/61 |
| 5,430,321 | 7/1995 | Effelsberg | 257/463 |

FOREIGN PATENT DOCUMENTS

| | | |
|---|---|---|
| 61-203630 | 9/1986 | Japan . |
| 1-173708 | 7/1989 | Japan . |
| 2-94431 | 4/1990 | Japan . |
| 3-55437 | 8/1991 | Japan . |
| 4-207079 | 7/1992 | Japan ................................ 257/82 |

*Primary Examiner*—Sara W. Crane
*Assistant Examiner*—Courtney A. Bowers
*Attorney, Agent, or Firm*—Young & Thompson

[57]  ABSTRACT

The invention provides a semiconductor substrate comprising a substrate of a first material and a crystal growth layer formed on the substrate, the crystal growth layer being made of compound semiconductors different from the first material wherein the substrate has a surface diffusion region being heavily doped with one or more elements of the compound semiconductors. A silicon substrate receives an ion-implantation of one or more elements constituting a compound semiconductor different except for silicon at a high impurity concentration for a heat treatment at a higher temperature than a growth temperature of the compound semiconductor and subsequent cooling down to the growth temperature of the compound semiconductor followed by crystal growth of the compound semiconductor on the substrate.

8 Claims, 2 Drawing Sheets

SUBSTRATE WITH A COMPOUND SEMICONDUCTOR SURFACE LAYER AND METHOD FOR PREPARING THE SAME

BACKGROUND OF THE INVENTION

The invention relates to a semiconductor substrate and a method for forming the same, and more particularly to a semiconductor substrate formed with an epitaxial layer made of compound semiconductors thereon and a method for forming the same.

Compound semiconductors such as GaAs and InP have been received a great deal of attention rather than silicon semiconductor as possessing excellent properties such as high electron mobility being suitable for high frequency and high speed devices as well as showing a radiative recombination due to a direction transition being suitable for optical devices such as light emitting diodes.

Such compound semiconductors are, however, engaged with the following disadvantages. In view of increasing the productivity of compound semiconductor devices, it is preferable to use a semiconductor having a possible large diameter. It would, however, be difficult to obtain a mono-crystal ingot of compound semiconductors with a large diameter as the compound semiconductors comprises a plurality of elements contrary to the silicon ingot, although such a large diameter mono-crystal ingot is suitable for epitaxial growth thereof. Further, the compound semiconductor substrate possesses a relatively low thermal conductivity rather than the silicon substrate. The low thermal conductivity causes a thermal accumulation in the substrate. This prevents the compound semiconductor device from exhibiting any excellent performance and also results in a reduction of efficiency of power consumption of the device. Moreover, such the compound semiconductors as GaAs and InP are costly materials.

On the other hand, silicon seems to have different properties from the properties of the compound semiconductors such as GaAs and InP. For example, it seems relatively easy to obtain a silicon substrate with a large diameter. Silicon has a relatively high thermal conductivity. Silicon is also an inexpensive material.

The compound semiconductor transistors or the light emitting diodes using the compound semiconductors requires the compound semiconductors to form an active layer on a substrate in which the compound semiconductor active layer has such a small thickness as several micrometers, while the substrate has such a large thickness as several hundreds micrometers. In the above viewpoints, in order to bring out the respective advantageous properties of the compound semiconductors and silicon, it was proposed to epitaxially grow an active layer made of compound semiconductors on a silicon substrate with a large diameter. Such silicon substrate having a large diameter formed thereon with the thin active layer made of the compound semiconductors are engaged with problems concerned with the lattice mismatching between silicon and the compound semiconductors such as GaAs and InP. For example, silicon has a lattice constant of 0.543 nanometers, while GaAs and AlAs have lattice constants of 0.565 0.566 nanometers respectively. Such a difference in the lattice constant or the lattice mismatching between silicon and the compound semiconductors to be grown on silicon makes it difficult to achieve a direct epitaxial growth of the compound semiconductors on silicon.

To settle the above problems as to the lattice mismatching between silicon and the compound semiconductors, it was proposed to use direct or indirect epitaxial growth of compound semiconductors on the silicon substrate. It is disclosed in the Japanese laid-open patent application No. 61-203630 to use a molecular beam epitaxy method in which an epitaxial growth of amorphous GaAs layer on a silicon substrate at a low temperature of 200° C. is carried out for local crystallization thereof by irradiation of laser beam such as Ar laser beam to form such grains of crystals as to allow for subsequent recrystal-growth of GaAs by use of the molecular beam epitaxy at 550° C. as a high temperature of the semiconductor. This prior art has such a problem as described below. It is required to conduct precise and strict scanning operation of Ar laser beam in which a laser beam is irradiated on the amorphous GaAs layer in stripe or in matrix thereby the laser beam irradiation in stripe or in matrix makes a mono-crystal GaAs in stripe or in matrix involved in the amorphous GaAs in which a pitch of the stripe or the matrix is required to be in the range of from 15 to 100 micrometers to obtain a good surface homology of the resultant single crystal GaAs layer. This results in the necessity of complicated and strict processes.

An another prior art is also disclosed in the Japanese laid-open patent application No. 2-94431. A spontaneous oxide film on a surface of a silicon substrate is removed to avoid an influence to an epitaxial growth of compound semiconductor on a silicon substrate. A silicon substrate is subjected to a heat treatment at a temperature of 1000° C. in hydrogen within a heat reactor to remove a spontaneous oxide film. At a temperature in the range from 600° C. to 700° C., a surface of the silicon substrate from which the oxide film was removed is subjected to a flow of AsH$_3$ to be covered with As. The silicon substrate covered with As is introduced into a metal organic chemical vapor deposition apparatus for subsequent GaAs growth on the silicon substrate. The silicon substrate with the GaAs is again introduced into the heat reactor for being subjected to a heat treatment at a temperature of 900° C. in AsH$_3$. In this prior art, although an object of the latter heat treatment is to reduce a dislocation due to lattice mismatching, dislocations tend to be generated due to differences in both the lattice constant and the coefficient of thermal expansion. This makes it difficult to obtain a semiconductor substrate of a good crystal structure.

Other prior art is also disclosed in the Japanese laid-open patent application No. 3-55437 in which a silicon substrate is subjected to an organic solvent cleaning using organic solvents such as trichlene, acetone and isopropyl alcohol. The silicon substrate is then immersed for five minutes into an etchant where H$_2$SO$_4$:H$_2$O$_2$=4:1 thereby a thin oxide film is formed on a surface of the silicon substrate. A 5% HF liquid is used to remove the oxide film which will be repeated a few times. The silicon substrate is then immersed into the etchant where H$_2$SO$_4$:H$_2$O$_2$=4:1 for five minutes to form a thin oxide film on the surface of the silicon substrate. This oxide film is to protect the silicon substrate from suffering any pollution during introduction of the silicon substrate into a vacuum. The substrate is then introduced into a preparation room in an apparatus for molecular beam epitaxy for a subsequent heat treatment for thirty minutes at a temperature in the range of from 1000° C. to 1050° C. in an ultra high vacuum to not only remove the oxide film from the surface of the silicon substrate but also form a crystal step of biatomic layer on the surface of the silicon substrate. The temperature is dropped down to 300° C. for subsequent introduction of the silicon substrate into the growth chamber. The temperature of the substrate is subjected to an irradiation of As molecular beam during increase of the temperature of the silicon substrate up to 600° C. for a subsequent irradiation of As and Ga molecular beams to form a GaAs layer on the silicon substrate. In this prior art, the temperature of the substrate is increased up to 1000° C. or more within the growth chamber. It seems difficult to enlarge the size of the apparatus for crystal growth on account of thermal resistivity of materials for the apparatus. This conventional method is unsuitable for mass production.

SUMMARY OF THE INVENTION

Accordingly, it is a primary object of the present invention to provide a novel method for forming a substrate with an epitaxial layer of compound semiconductors, which is free from any disadvantages as described above.

It is a further object of the present invention to provide a novel substrate with an epitaxial layer of compound semiconductors, which is free from any disadvantages as described above.

The above and other objects, features and advantages of the present invention will be apparent from the following descriptions.

The present invention provides a substrate comprising a bulk layer made of either a semiconductor or an insulating material and an epitaxial layer made of compound semiconductors different from the semiconductor wherein at an interface between the bulk layer and the epitaxial layer the epitaxial layer, a diffusion layer is formed, which is heavily doped with one or more elements constituting the compound semiconductors of the epitaxial layer.

The present invention also provide a novel method of forming the substrate. A substrate made of either a semiconductor or an insulator is subjected to an ion-implantation at a high impurity concentration with one or more elements constituting compound semiconductors different from the semiconductor of the substrate. The substrate is then introduced into a growth chamber for subsequent heat treatment at a temperature of the substrate higher than a growth temperature of the compound semiconductors on the substrate. The temperature of the substrate is dropped to the growth temperature of the compound semiconductors for subsequent crystal growth of the compound semiconductors on the substrate.

BRIEF DESCRIPTION OF THE DRAWINGS

Preferred embodiments of the present invention will hereinafter fully be described in detail with reference to the accompanying drawings.

DESCRIPTION OF THE INVENTION

Figure 1:
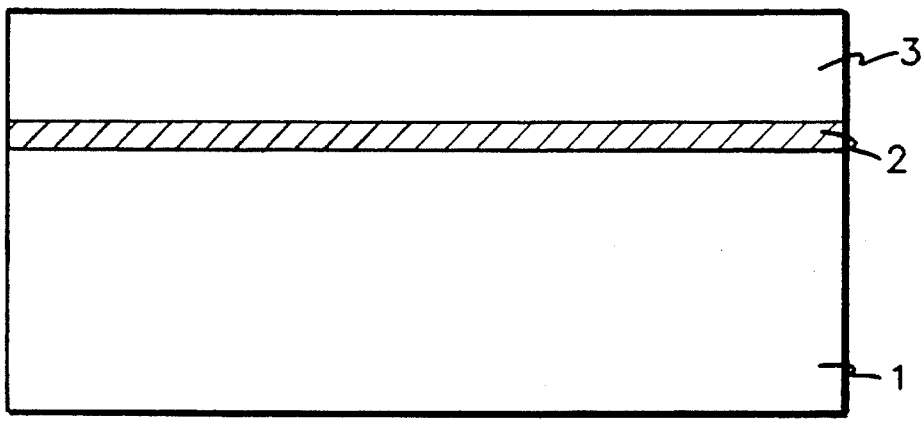
FIG. 1 is a fragmentary cross sectional elevation view illustrative of a novel substrate formed thereon with an epitaxial layer of compound semiconductors in first and second embodiments according to the present invention.

The present invention provides a substrate comprising a bulk layer made of either a semiconductor or an insulating material and an epitaxial layer made of compound semiconductors different from the semiconductor wherein at an interface between the bulk layer and the epitaxial layer the epitaxial layer, a diffusion layer is formed, which is heavily doped with one or more elements constituting the compound semiconductors of the epitaxial layer.

According to the above novel structure of the substrate, one or more elements constituting the compound semiconductors are implanted at a large dose into a surface of the bulk layer of the substrate to break a crystal structure of a surface region of the bulk layer such as a silicon crystal for a subsequent heat treatment which permits the crystal structure of the surface region to become similar to a crystal structure of the crystal growth layer. Such a crystal structure change of the ion-implanted surface region causes the lattice strain which permits the compound semiconductor layer to have a perfect crystal structure. It seems difficult to cause a relatively large lattice strain by a gas diffusion method or other methods. A relatively large lattice strain requires a uniform diffusion at a higher impurity concentration than a critical concentration for solid solution.

The silicon substrate whose surface is heavily doped by an ion-implantation process is then subjected to a heat treatment at a temperature in the range of from 800° C. to 950° C. to permit the surface region to recover a crystal structure and to permit a diffusion of the doped impurity so that the impurity concentration become lower than the critical concentration for solid solution. At the ion-implanted surface region of the silicon substrate, the impurity or the elements doped into the surface region is accumulated so as to have a super high concentration so that the impurity soaks out of the surface of the substrate. The substrate is then cooled down to a crystal growth temperature in the range of from 500° C. to 600° C. thereby the existence of the impurity of the element at a high concentration provides a strain to the crystal structure so that the crystal structure of the surface region approaches the crystal structure of the epitaxial layer of the compound semiconductors. The elements soaking out the surface region may form crystal grains uniformly and finely dispersed which permits the epitaxial layer of the compound semiconductors to have a good surface homology.

It is preferable to form an oxide film on the surface of the silicon substrate to prevent carbon to bond with silicon, namely to prevent SiC to be formed. It is preferable to use a mixture liquid of ammonia and hydrogen peroxide to form the oxide film. The oxide film has a weak bonding structure which tends to show a vaporization at a temperature of 800° C.

When III-V group compound semiconductors such as GaAs and InP are grown on a silicon substrate, V-group elements are preferable to be implanted as having a higher degree of solid solution, namely as not forming a eulectic compound with silicon.

A first embodiment according to the present invention will hereinafter be described in detail with reference to FIGS. 1 and 2 in which there is provided a substrate comprising a silicon substrate and an epitaxial layer made of a GaAs compound semiconductor wherein an ion-implanted diffusion layer is formed on a surface of the silicon layer.

Figure 2:
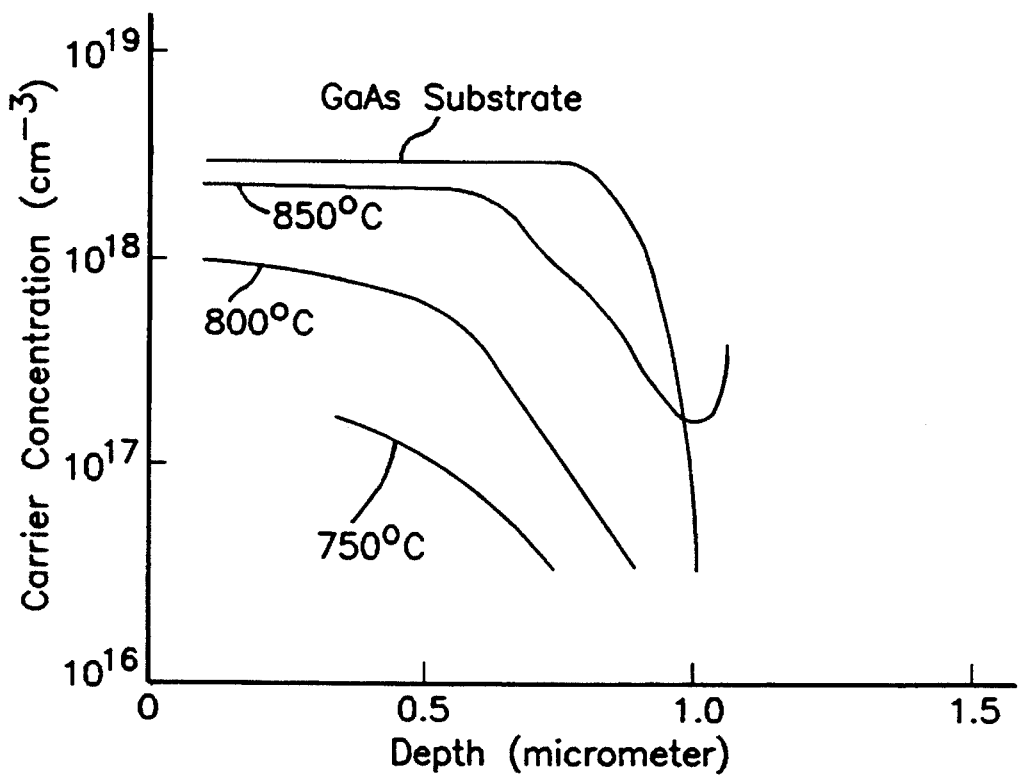
FIG. 2 is a diagram illustrative of an impurity concentration profile of a diffusion layer involved in a substrate of a first embodiment according to the present invention.

A structure of the substrate is illustrated in FIG. 1 in which a (100) silicon substrate 1 is formed by a floating zone method. The silicon substrate has a diameter of 100 millimeters and a thickness of 470 micrometers. The silicon substrate 1 is doped with an n-type dopant to permit the substrate to have a resistivity of 2 to 4 kΩcm. An ion-implanted diffusion layer 2 formed on the silicon substrate 1 is implanted with As at an impurity concentration in the range of from $10^{20}$ to $10^{21}$ cm$^{-3}$. The ion-implanted diffusion layer 2 has a thickness of approximately 0.1 micrometers. An GaAs epitaxial layer 3 having a thickness of 1.0 micrometer is formed on the ion-implanted diffusion layer 2. The GaAs epitaxial layer 3 is doped with an n-type dopant of silicon to have a dopant concentration of $3\times10^{18}$ cm$^{-3}$.

A method of forming the substrate will be described. The silicon substrate 1 is subjected to an organic solvent cleaning using methylketone and subsequent organic solvent cleaning using ethanol. The silicon substrate is immersed for ten minutes into a liquid including NH$_4$OH(28%), H$_2$O$_2$(30%) and H$_2$O wherein NH$_4$OH(28%):H$_2$O$_2$(30%):H$_2$O-1:1:5 and a temperature of the liquid is 80° C. thereby a surface of the silicon substrate receives oxidation etching for subsequent water washing treatment. Without drying the silicon substrate, immediately thereafter, the silicon substrate is immersed into HF(49%) for one minute to remove a surface oxide film from the silicon substrate for subsequent washing with water so that any organic pollutant is removed from the surface of the silicon substrate. The silicon substrate is subsequently immersed for 20 minutes into a liquid including HCl(30%), H$_2$O$_2$(30%) and H$_2$O wherein HCl:H$_2$O$_2$:H$_2$O=1:1:5 and a temperature of the liquid is 80° C. thereby a surface of the silicon substrate is exposed to oxidation etching for subsequent water washing. Immediately thereafter, the silicon substrate is immersed into HF(49%) for one minute to remove the surface oxide film for a water washing and subsequent centrifugal dry process. This results in that any metal pollutant is removed from the surface of the silicon substrate.

Within an hour, the silicon substrate 1 is introduced into an ion-implantation apparatus to be subjected to an ion-implantation with $^{75}$As' under the conditions of a dose of $1\times10^{16}$ cm$^{-2}$ and an acceleration energy of 50 KeV to form the ion-implantation diffusion layer 2.

The silicon substrate 1 is then immersed for five minutes into a liquid including H$_2$SO$_4$(97%) and H$_2$O$_2$ wherein H$_2$SO$_4$:H$_2$O$_2$=4:1 and a temperature of the liquid is 100° C. thereby a surface of the silicon substrate is exposed to oxidation etching for subsequent water washing. Immediately thereafter, the silicon substrate is immersed into HF(49%) for one minute to remove the surface oxide film. The silicon substrate is immersed for five minutes into a liquid including NH$_4$OH(28%), H$_2$O$_2$(30%) and H$_2$O wherein NH$_4$OH(28%):H$_2$O$_2$(30%):H$_2$O=1:4:20 and a temperature of the liquid is 60° C. thereby a surface of the silicon substrate receives oxidation etching for a water washing treatment and subsequent centrifugal dry process. This treatment permits the oxide film to have a weak bonding and to include ammonia group.

Within a few hours, the silicon substrate is introduced into a molecular beam epitaxy apparatus in which a pressure is dropped to $10^{-10}$ torr or less. The silicon substrate 1 is exposed to As beam irradiation together with an increase of a temperature of the silicon substrate up to 850° C. at which the silicon substrate is maintained for 20 minutes so that the surface oxide film shows a sublimation and a crystal structure of the ion-implanted surface region is recovered. The silicon substrate is further exposed to the As beam irradiation with a drop of the substrate temperature down to 550° C. A Si ion-implantation is accomplished under the conditions of As/Ga flux ratio of 4 and a Si concentration of $2\times10^{18}$ cm$^{-3}$ so that GaAs is grown on the surface of the silicon substrate at a growth rate of 20 nanometers/minutes until the epitaxial GaAs layer has a thickness of 1.0 micrometers to form the n-GaAs epitaxial layer 3 on the ion-implanted diffusion layer 2.

As described above, the silicon substrate has a mirror surface. In the surface homology, there is none of any remarkable boundary line with crystal grain growth. The epitaxial GaAs layer has a good surface as like when the GaAs layer is formed on the GaAs substrate by molecular beam epitaxy.

As a comparative example, without As ion-implantation into the silicon substrate, the GaAs is grown directly on the silicon surface by a heat treatment of 850° C. and a subsequent crystal growth in the molecular beam epitaxy apparatus. This results in that the surface has a dark gray color and has a remarkable boundary line due to the crystal grain growth and the surface is a remarkably uneven. Hall mobility measurement is accomplished to measure a Hall mobility of a conductive layer only except for the silicon substrate. It was confirmed that the Hall mobility is 3100 cm$^2$/Vs in the first embodiment, while in the comparative example, in the comparative example, the GaAs layer is in an amorphous like state. When the GaAs layer is formed on a semi-insulating GaAs substrate having a diameter of 50 millimeters, the measured Hall mobility was 3400 cm$^2$/Vs. The present invention may provides the GaAs epitaxial layer like the GaAs layer formed on the GaAs substrate.

The description will focus on the temperature of the heat treatment for 20 minutes before the crystal growth process by molecular beam epitaxy. FIG. 2 illustrates carrier concentration profiles measured by C-V measurement at the temperature of the heat treatments of 750° C., 800° C. and 850° C. As a comparison, further illustrated is a carrier concentration profile when the n-GaAs layer with a thickness of 1.0 micrometer is grown on the semi-insulating GaAs substrate. When the thickness of the GaAs grown on the GaAS substrate reaches 0.2 micrometers or more, a carrier concentration reaches a predetermined value of $3\times10^{18}$ cm$^{-3}$. When the thickness of the GaAs grown at a temperature of 850° C. on the silicon substrate reaches 0.4 micrometers or more, the carrier concentration reaches the predetermined value.

Under a relatively low temperature of 800° C. of the previous heat treatment to the crystal growth process, the carrier concentration of the n-GaAs layer reaches only $1\times10^{18}$ cm$^{-3}$. This indicates that the increase of the carrier concentration toward the growth direction seems to be delay. At the lower temperature of 750° C., the increase of the carrier concentration toward the growth direction seems to be more delay. The resultant carrier concentration was only 1/10 times of the predetermined value. The crystal growth surface has a gray color and the remarkable boundary line as well as the remarkable surface unevenness when the temperature of the previous heat treatment is low, for example, 750° C. or 800° C. Approximately 850° C. of the previous heat treatment seems to be preferable.

It seems that the carrier concentration is dropped in the vicinity of interface of the n-GaAs layer with the silicon substrate, which is caused by a lattice mismatching. The increase of the carrier concentration together with the crystal growth proves that the crystal structure is recovered and the impurity is located to match the crystal structure. It was observed that at the interface of the n-GaAs layer to the silicon substrate, the carrier concentration is dropped to $2\times10^{17}$ cm$^{-3}$ for subsequent increase of the carrier concentration. The increase of the carrier concentration is caused by activation of the As as ion-implanted into the silicon substrate. From the above results, it could be appreciated that a heat treatment at 1000° C. or less prior to the growth process permits the grown n-GaAs layer to have the good crystal structure.

A second embodiment of the present invention will be described in which there is provided a substrate comprising a silicon substrate and an epitaxial layer made of a GaAs compound semiconductor wherein an ion-implanted diffusion layer is formed on a surface of the silicon layer.

A structure of the substrate is illustrated in FIG. 1 in which a (100) silicon substrate 1 is formed by a floating zone method. The silicon substrate has a diameter of 76 millimeters and a thickness of 380 micrometers. The silicon substrate 1 is doped with an n-type dopant to permit the substrate to have a resistivity of 2 to 4 kΩcm. An ion-implanted diffusion layer 2 formed on the silicon substrate 1 is implanted with As at an impurity concentration in the range of from $10^{20}$ to $10^{21}$ cm$^{-3}$. The ion-implanted diffusion layer 2 has a thickness of approximately 0.1 micrometers. A GaAs epitaxial layer 3 having a thickness of 1.0 micrometer is formed on the ion-implanted diffusion layer 2. The GaAs epitaxial layer 3 is doped with an n-type dopant of silicon to have a dopant concentration of $3\times10^{18}$ cm$^{-3}$.

A method of forming the substrate will be described. The silicon substrate is subjected to the same previous treatments as the first embodiment for subsequent As implantation process which are also the same as the first embodiment.

The silicon substrate 1 is introduced into a metal organic vapor phase epitaxy apparatus which comprises a quartz glass core tube, a SiC coat susceptor located in the core tube, high frequency heating coils placed around the core tube and a gas supply system for supping gases into the core tube. The apparatus could process a solo wafer for every time. In the core tube, $H_2$ and arsine flow at 1000 cc/minute and 40 cc/minute respectively wherein an internal pressure is 50 torr. The substrate temperature is raised up to 850° C. to be maintained at the same temperature for 20 minutes to accomplish a heat treatment. The substrate temperature is then dropped down to 550° C. In the core tube, $H_2$ and arsine flow at 1000 cc/minute and 40 cc/minute respectively wherein an internal pressure is 50 torr and the flow rate of $AsH_3$ to $(CH_3)_3Ga$ to $SiH_4$ as a doping gas is 1:0.02:0.01 thereby GaAs is grown to form the n-GaAs epitaxial layer with a dopant concentration of $3\times10^{18}$ cm$^{-3}$ and a thickness of 1.0 micrometers.

Figure 3:
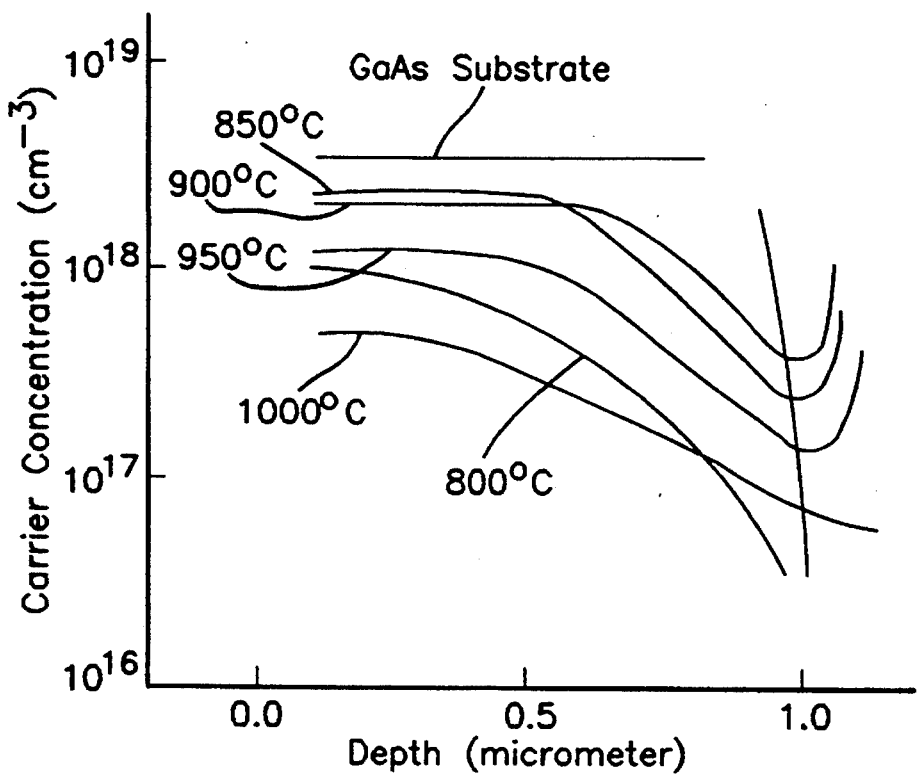
FIG. 3 is a diagram illustrative of an impurity concentration profile of a diffusion layer involved in a substrate of a second embodiment according to the present invention.

The description will focus on the temperature of the heat treatment for 20 minutes before the crystal growth process by molecular beam epitaxy. FIG. 3 illustrates carrier concentration profiles measured by C-V measurement at the temperature of the heat treatments in the range of from 800° C. to 1000° C. at an interval of 50° C. As a comparison, further illustrated is a carrier concentration profile when the n-GaAs layer with a thickness of 1.0 micrometer is grown on the semi-insulating GaAs substrate. When the thickness of the GaAs grown on the GaAS substrate reaches 0.2 micrometers or more, a carrier concentration reaches a predetermined value of $3\times10^{18}$ cm$^{-3}$. When the thickness of the GaAs grown at temperatures of 850° C. and 900° C. on the silicon substrate reaches 0.4 micrometers or more, the carrier concentration reaches the predetermined value. At these temperatures of 850° C. to 900° C., the maximum impurity concentration was obtained. At a lower temperature than the above, the recovery of the doped Si is insufficient, while at a higher temperature than the above, an evaporation of As and a generation of silicon dislocation appear.

The crystal growth surface state depends upon the temperature of the previous heat treatment accomplished prior to the growth process. At the temperature of the heat treatment of 850° C. to 900° C., a good mirror face was obtained, while at the temperature of the heat treatment of 800° C. to 950° C. a clouded face was obtained. At the temperature higher and lower than the temperature in the range from 850° C. to 900° C., the surface has a remarkable unevenness. It could therefore be appreciated that an optimum temperature for the previous heat treatment to the growth process is in the range of from 850° C. to 900° C.

Figure 4:
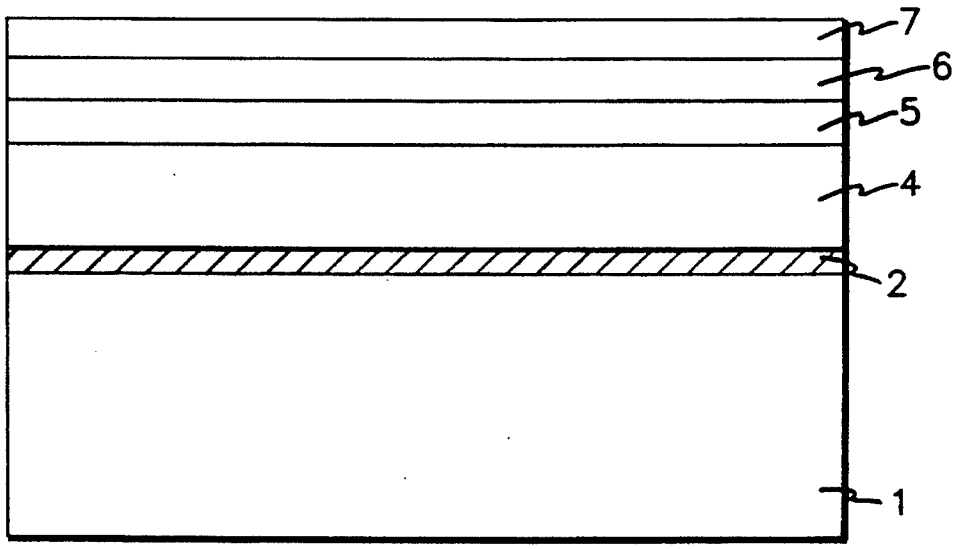
FIG. 4 is a fragmentary cross sectional elevation view illustrative of a novel substrate formed thereon with an epitaxial layer of compound semiconductors in a third embodiment according to the present invention.

A third embodiment according to the present invention will be described with reference to FIG. 4 in which there is provided a substrate for heterostructure field effect transistors. A structure of the substrate is illustrated in FIG. 4 in which a (100) silicon substrate 1 is formed by a floating zone method. The silicon substrate has a diameter of 100 millimeters and a thickness of 470 micrometers. The silicon substrate 1 is doped with an n-type dopant to permit the substrate to have a resistivity of 2 to 4KΩ cm. An ion-implanted diffusion layer 2 formed on the silicon substrate 1 is implanted with As at an impurity concentration in the range of from $10^{20}$ to $10^{21}$ cm$^{-3}$. The ion-implanted diffusion layer 2 has a thickness of approximately 0.1 micrometers. An GaAs epitaxial layer 3 having a thickness of 1.0 micrometer is formed on the ion-implanted diffusion layer 2. The GaAs epitaxial layer 3 is doped with an n-type dopant of silicon to have a dopant concentration of $3\times10^{18}$ cm$^{-3}$.

A method of forming the substrate will be described. The silicon substrate is subjected to the same previous treatments as the first embodiment for subsequent As implantation process which are also the same as the first embodiment.

A non-doped GaAs layer 4 having a thickness of 1000 nanometers is formed by molecular beam epitaxy on the ion-implanted diffusion layer. A non-doped $In_{0.15}Ga_{0.85}As$ layer 5 having a thickness of 15 nanometers is formed by molecular beam epitaxy on the non-doped GaAs layer 4. An n-doped AlGaAs layer 6 having a thickness of 35 nanometers and a dopant concentration of $2\times10^{18}$ cm$^{-3}$ is formed by molecular beam epitaxy on the non-doped InGaAs layer 5. An n-doped GaAs layer 7 having a thickness of 20 nanometers and a dopant concentration of $3\times10^{18}$ cm$^{-3}$ is formed by molecular beam epilaxy on the n-doped AlGaAs layer 6.

In this embodiment, prior to the molecular beam epitaxy process, a heat treatment was accomplished at a temperature of 900° C. for ten minutes. During the molecular beam epitaxy process, the temperature of the substrate is maintained at 550° C.

The obtained crystal growth surface is almost the mirror face. Hall measurement is carried out to confirm that a sheet carrier concentration and a mobility are $1.8\times10^{12}$ cm$^{-2}$ and 3800 cm$^2$/Vs respectively at a room temperature, while at 77K the both are $1.9\times10^{12}$ cm$^{-2}$ and 7800 cm$^2$/Vs respectively. As a comparative example, a semi-insulating GaAs substrate is used. In this case, the sheet carrier concentrations at the above temperatures are the same as the above, while the mobility were 4200 cm$^2$/Vs at the room temperature and 9400 cm²/Vs at 77K. In this embodiment using the silicon substrate, a two dimensional electron gas was formed. This indicates that the non-doped GaAs layer 4 has a good crystal structure.

A fourth embodiment according to the present invention will hereinafter be described in detail with reference to FIG. 5 in which there is provided a substrate comprising an insulating substrate or a sapphire (alpha-$Al_2O_3$) substrate and an epitaxial layer made of a GaAs compound semiconductor wherein an ion-implanted diffusion layer is formed on a surface of the silicon layer.

Figure 5:
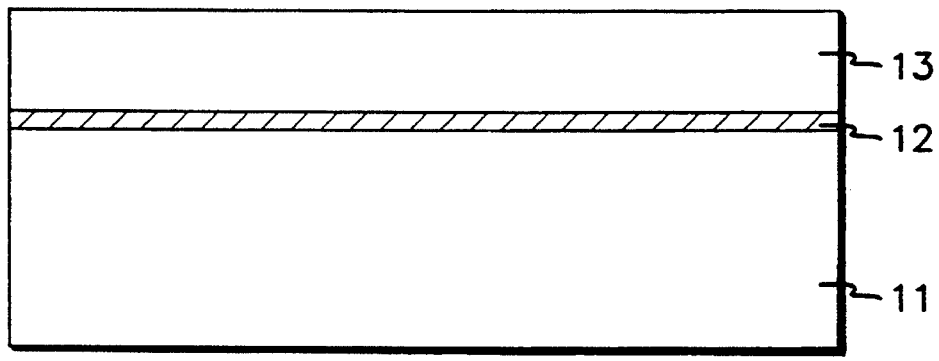
FIG. 5 is a fragmentary cross sectional elevation view illustrative of a novel substrate formed thereon with an epitaxial layer of compound semiconductors in a fourth embodiment according to the present invention.

A structure of the substrate is illustrated in FIG. 5 in which a (102) sapphire substrate 11 is formed by a pull method. The sapphire substrate has a diameter of 100 millimeters and a thickness of 600 micrometers. An ion-implanted diffusion layer 12 formed on the sapphire substrate 11 is implanted with P at an impurity concentration in the range of from $10^{20}$ to $10^{21}$ cm$^{-3}$. The ion-implanted diffusion layer 12 has a thickness of approximately 0.1 micrometers. A GaP epitaxial layer 13 having a thickness of 1.0 micrometer is formed on the ion-implanted diffusion layer 12. The GaP epitaxial layer 13 is not doped.

A method of forming the substrate will be described. The sapphire substrate 11 is subjected to a organic solvent cleaning using methylketone and subsequent organic solvent cleaning using ethanol. The sapphire substrate 1 is then introduced into an ion-implantation apparatus to be subjected to an ion-implantation with $^{31}p^+$ under the conditions of a dose of $1 \times 10^{16}$ cm$^{-2}$ and an acceleration energy of 30 KeV to form the ion-implantation diffusion layer 12.

The sapphire substrate 11 is subjected to the organic solvent cleaning for subsequent introduction into a metal organic vapor phase epitaxy apparatus. $H_2$ and $PH_3$ flow at 1000 cc/minute and 100 cc/minute respectively wherein an internal pressure is 50 torr. The substrate temperature is raised up to 850° C. to be maintained at the same temperature for 20 minutes to accomplish a heat treatment. The substrate temperature is then dropped down to 550° C. In the core tube, $H_2$ and arsine flow at 1000 cc/minute and 60 cc/minute respectively wherein an internal pressure is 50 torr and the flow rate of $(CH_3)_3Ga$ to $PH_3$ is 1:0.02 thereby GaP is grown to form the non-doped GaP epitaxial layer 13 with a thickness of 1.0 micrometers.

The GaP layer 13 grown on the sapphire substrate 11 by metal organic chemical vapor deposition has substantially the mirror surface whose surface homology has a slight boundary line due to the crystal grain growth. As a comparative example, without P ion-implantation into the silicon substrate, the GaP is grown directly on the silicon surface by a heat treatment of 850° C. and a subsequent crystal growth in the molecular beam epitaxy apparatus. This results in that the surface has a dark gray color and has a remarkable boundary line due to the crystal grain growth and the surface is a remarkably uneven. As another comparative example, without any heat treatment, the ion-implantation process is accomplished for a crystal growth of the GaP layer. The result is the same as the above comparative example.

Although in the above embodiments the III-V compound semiconductor layer is epitaxially grown on the silicon substrate, the present invention is no doubt applicable to epitaxial growth of II-VI compound semiconductors. Further, the present invention may also be applicable to the growth of teranary ternary and quaternary compound semiconductors on the silicon substrate.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications which fall within the sprit and scope of the invention.

What is claimed is:

1. A semiconductor substrate comprising a substrate of a first material and a crystal growth layer formed on said substrate, said crystal growth layer being made of at least one compound semiconductor different from said first material, wherein said substrate has a surface diffusion region being doped with a doping element of said at least one compound semiconductor at a doping concentration within the range from $1 \times 10^{20}$ atoms/cm$^3$ to $1 \times 10^{21}$ atoms/cm$^3$, said doping element having a concentration at an interface of said surface diffusion region and said crystal growth layer higher than $1 \times 10^{20}$ atoms/cm$^3$, said doping element being present at said interface in the form of fine crystal grains uniformly and finely dispersed at said interface, and said crystal growth layer having a mirror face.

2. The semiconductor substrate as claimed in claim 1, wherein said first material is a semiconductor.

3. The semiconductor substrate as claimed in claim 2, wherein said first material is silicon.

4. The semiconductor substrate as claimed in claim 1, wherein said first material is an insulator.

5. The semiconductor substrate as claimed in claim 4, wherein said first material is sapphire.

6. The semiconductor substrate as claimed in claim 1, wherein said at least one compound semiconductor is a III-V group compound semiconductor.

7. The semiconductor substrate as claimed in claim 6, wherein said at least one compound semiconductor is GaAs.

8. The semiconductor substrate as claimed in claim 6, wherein said at least one compound semiconductor is GaP.

* * * * *